United States Patent
Cole et al.

(10) Patent No.: US 11,360,120 B2
(45) Date of Patent: Jun. 14, 2022

(54) SYSTEM AND METHOD FOR HANDLING AND CHARTING DATA OBTAINED BY AN INSPECTION VEHICLE

(71) Applicant: ABB Power Grids Switzerland AG, Baden (CH)

(72) Inventors: Gregory A. Cole, West Hartford, CT (US); William J. Eakins, Bloomfield, CT (US); Daniel T. Lasko, Bloomfield, CT (US); Harshang Shah, Bloomfield, CT (US); Thomas A. Fuhlbrigge, Ellington, CT (US); Luiz V. Cheim, St. Charles, MO (US); Poorvi Patel, Ballwin, MO (US); Biao Zhang, West Hartford, CT (US); Saumya Sharma, Hartford, CT (US); Sanguen Choi, Simsbury, CT (US)

(73) Assignee: HITACHI ENERGY SWITZERLAND AG, Baden (CH)

( * ) Notice: Subject to any disclaimer, the term of this patent is extended or adjusted under 35 U.S.C. 154(b) by 131 days.

(21) Appl. No.: 16/434,610

(22) Filed: Jun. 7, 2019

(65) Prior Publication Data
US 2019/0391183 A1 Dec. 26, 2019

Related U.S. Application Data

(63) Continuation of application No. PCT/IB2017/001671, filed on Dec. 7, 2017.
(Continued)

(51) Int. Cl.
*G01R 13/02* (2006.01)
*G01R 31/62* (2020.01)
*G05D 1/02* (2020.01)

(52) U.S. Cl.
CPC ......... *G01R 13/0281* (2013.01); *G01R 31/62* (2020.01); *G05D 1/0206* (2013.01)

(58) Field of Classification Search
CPC .. G01R 13/0281; G01R 13/62; G05D 1/0206; G05B 2219/45066; G05B 2219/37448; G01C 17/003; G01C 17/01; G01C 17/013
See application file for complete search history.

(56) References Cited

U.S. PATENT DOCUMENTS

| | | | |
|---|---|---|---|
| 6,104,970 A | 8/2000 | Schmidt, Jr. et al. | |
| 2007/0129914 A1* | 6/2007 | Yano ................. | G05B 23/0283 702/184 |

(Continued)

FOREIGN PATENT DOCUMENTS

EP 1308829 A2 5/2003

OTHER PUBLICATIONS

International Search Report and Written Opinion of the International Searching Authority, PCT/IB2017/001671, dated May 15, 2018, 13 pages.

(Continued)

*Primary Examiner* — Aaron L Troost
(74) *Attorney, Agent, or Firm* — Sage Patent Group

(57) ABSTRACT

A method and system for acquiring, manipulating and displaying inspection data obtained by sensors associated with submersible inspection vehicle within a housing having a liquid medium is disclosed in the present application. A control system including an electronic controller is operably coupled with the inspection vehicle and is configured to display data transmitted from the sensor and overlay input data from an operator on the display to facilitate real time analysis during the inspection event.

30 Claims, 10 Drawing Sheets

Related U.S. Application Data

(60) Provisional application No. 62/431,319, filed on Dec. 7, 2016.

(56) References Cited

U.S. PATENT DOCUMENTS

| | | | | |
|---|---|---|---|---|
| 2012/0257704 | A1* | 10/2012 | Asada | G21C 17/013 |
| | | | | 376/249 |
| 2014/0205167 | A1* | 7/2014 | Kleiner | A61B 6/5223 |
| | | | | 382/131 |
| 2015/0369751 | A1 | 12/2015 | Cheim et al. | |
| 2016/0264262 | A1* | 9/2016 | Colin | G01N 29/04 |

OTHER PUBLICATIONS

International Preliminary Report on Patentability, PCT/IB2017/001671, dated Jun. 11, 2019, 9 pages.

* cited by examiner

SYSTEM AND METHOD FOR HANDLING AND CHARTING DATA OBTAINED BY AN INSPECTION VEHICLE

TECHNICAL FIELD

The present application generally relates to acquisition, handling and displaying inspection data obtained by an inspection vehicle in a housing having a liquid medium disposed therein, such as a transformer or the like.

BACKGROUND

An apparatus with a liquid-filled housing such as a power transformer or the like needs periodic inspection and maintenance. Liquid-filled housings are configured to hold electrically powered components and are often extremely heavy and difficult to transport and/or replace. In-situ inspection and maintenance can be a desirable alternative to replacement of such an apparatus. It is possible to drain the liquid from the housing prior to inspecting and repairing internal components, however this is a time consuming and expensive process. Real time data handling and analysis of the inspection data can present difficulties in such environments. Some existing systems have various shortcomings relative to certain applications. Accordingly, there remains a need for further contributions in this area of technology.

SUMMARY

One embodiment of the present application is a unique system and method for acquiring, charting and displaying inspection data related to defective components in a liquid filled housing. Other embodiments include apparatuses, systems, devices, hardware, methods, and combinations for handling and charting inspection data obtained by a submersible inspection vehicle operable within the housing. Further embodiments, forms, features, aspects, benefits, and advantages of the present application shall become apparent from the description and figures provided herewith.

DETAILED DESCRIPTION OF THE ILLUSTRATIVE EMBODIMENTS

Figure 1:
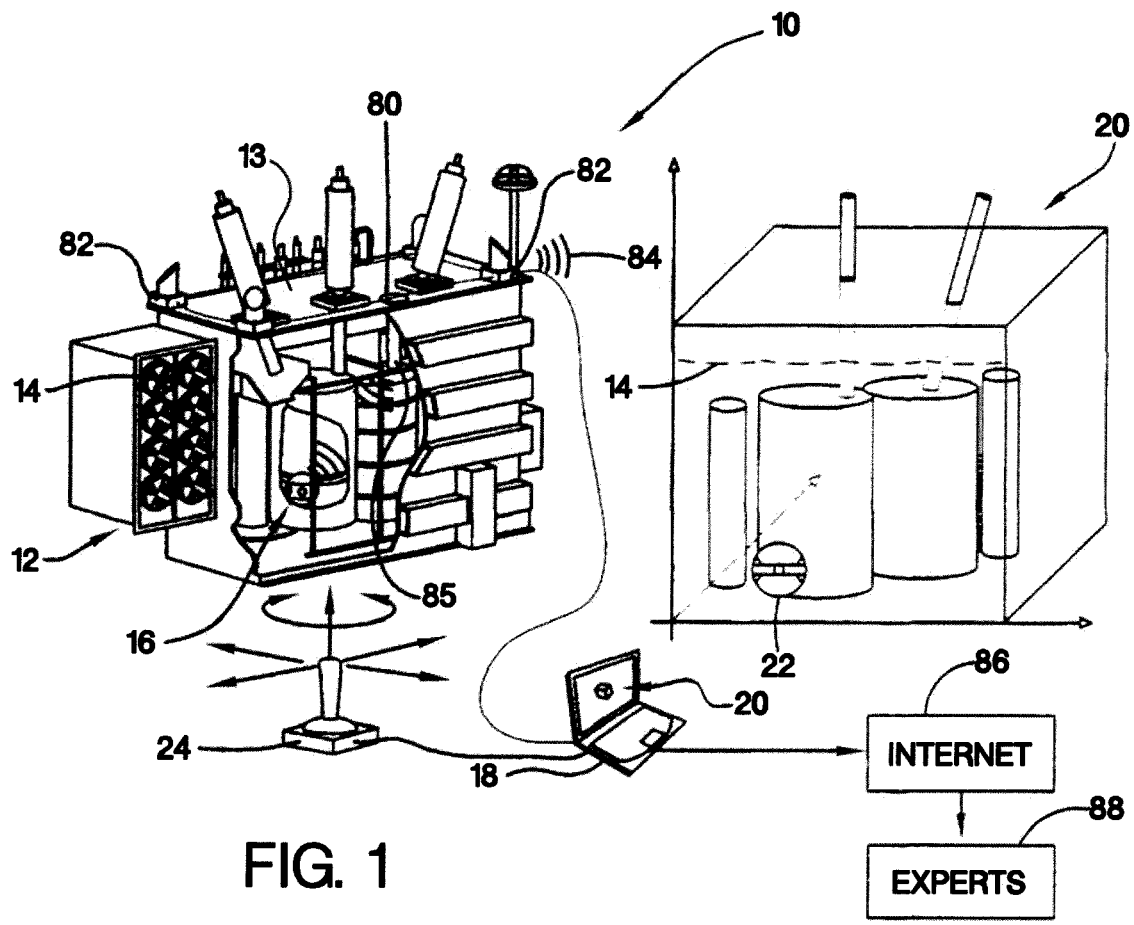
FIG. 1 is a schematic diagram of a system for in-situ inspection according to one exemplary embodiment of the present disclosure.

For the purposes of promoting an understanding of the principles of the application, reference will now be made to the embodiments illustrated in the drawings and specific language will be used to describe the same. It will nevertheless be understood that no limitation of the scope of the application is thereby intended. Any alterations and further modifications in the described embodiments, and any further applications of the principles of the application as described herein are contemplated as would normally occur to one skilled in the art to which the application relates.

The present disclosure is directed to in-situ inspection of electrical components or the like in a liquid filled housing. A liquid propelled inspection vehicle can be controlled wirelessly or with a tether connection within the housing depending on the particular application. In some embodiments the inspection vehicle may be automatically controlled with a control system. In other embodiments the inspection vehicle may be controlled in part automatically and in part through manual operator control means. In yet other embodiments the inspection vehicle may be controlled entirely through manual operator control means. In some embodiments the inspection vehicle may be submersible, but not have self-propelled capabilities. The operator may be located in close proximity to the housing or alternatively be located anywhere that communication means are available such as via internet, intranet or other network connection. Speed and efficiency are critical to inspecting large electrical components because they typically are powered down and/or taken off-line during the inspection and subsequent analysis of the component. Component downtime can be reduced if some of the operator burden in obtaining, charting, displaying and analyzing inspection data can be done automatically in real time during an inspection operation rather than after the inspection event. The present disclosure provides a system and method for rapid categorization, organization, charting and comparison of inspection data to ideal data and/or data from previous inspections of the component. In this manner component downtime and thus cost related to the downtime, inspection and repair can be minimized. The system and method includes dynamic chart generation and an inspection management process to allow an operator to focus on inspection tasks and streamline analysis of such inspection tasks. Multiple modes of data entry allow for an operator to collect, categorize and annotate information collected from one or more sensors including video data while maintaining full control of the inspection vehicle. Further, methods are disclosed to register and correlate inspection information from previous inspections with information from the current inspection event.

Referring to FIG. 1, a system for in-situ inspection of a liquid filled transformer designated generally by the numeral 10 is illustrated. It should be understood that while liquid filled electrical transformers are described and referenced in this application, the systems and methods described herein are not limited to liquid filled transformers, but on the contrary can be used with any liquid filled housing or container wherein physical inspection, data collection, data transmittal and repair procedures or the like are desired without prior draining of the liquid from the housing. By way of example, and not limitation, in-situ inspection may be performed on/in portions of ship hulls, electrical interrupters, high voltage switch gears, nuclear reactors, fuel tanks, food processing equipment, floating roof storage system, chemical storage tank, or other apparatuses of similar nature.

In one exemplary embodiment, the system 10 can be used for inspection, data transmittal and/or maintenance of a transformer 12. The transformer 12 contains high-voltage electrical components immersed in a cooling fluid 14 such as oil. Skilled artisans will appreciate that the inspection typically occurs when the transformer 12 is offline or not in use. The transformer 12 utilizes the cooling fluid 14 to maintain temperature and disburse heat generated by the internal components during operation of the transformer 12. In some embodiments, the cooling fluid 14 can include dielectric properties such that electrical conduction is reduced or entirely eliminated in the fluid 14. The transformer 12 can be maintained in a sealed configuration so as to prevent contaminants or other foreign matter from entering therein. As used herein, a "sealed configuration" of the tank or housing 13 allows for conduit ducts or other hardware associated with the transformer 12 to extend through a wall via a sealed joint formed with the housing 13 to allow for connection to electrical components and/or monitoring devices maintained in the housing 13. The housing 13 includes at least one opening to allow for ingress into and egress out of the housing 13. An inspection vehicle 16 sometimes referred to as a "robot," is insertable into the housing 13 of the transformer 12 and is controlled either by un-tethered wireless remote control or through a tether connection. In some embodiments an inspection vehicle or a separable portion thereof may be submersible without having self-propelled motive capability.

A computational device 18, such as a laptop computer or other appropriate computing device can communicate with the inspection vehicle 16 either by direct connection through a tether or wirelessly. The computer 18 may maintain a virtual transformer image 20 of the internal construction of the transformer 12. In some embodiments, this virtual image can be a computer-aided-design (CAD) image generated in construction or design of the transformer 12. However, in other forms, images such as photographs or actual real time video generated by sensors and cameras associated with the inspection vehicle 16 may be utilized. As will be described in further detail, the computer 18 may utilize the virtual transformer image 20 in conjunction with a virtual inspection vehicle 22, to represent the actual inspection vehicle 16, so as to monitor the positioning of the inspection vehicle 16 within the transformer 12. A motion control input device, such as a joystick 24 can be connected to the computer 18 and/or directly to the inspection vehicle 16 to allow an operator to control movement of the inspection vehicle 16 inside the transformer 12. Control of the inspection vehicle 16 can be aided by observations of the virtual inspection vehicle 22 as it moves about the virtual transformer image 20. In other words, an operator can control movement of the inspection vehicle 16 based on the observed position of the inspection vehicle 16 within the transformer 12. Other types of motion control input devices, such as those used in video games, handheld computer tablets, computer touch screens or the like may be employed without deviating from the teachings herein. It should be understood that in some applications the operator may be located on-site or near the apparatus to be inspected. However, in other applications the operator may be located off-site and indeed anywhere in the world through communication via World Wide Web internet connection.

Figure 2:
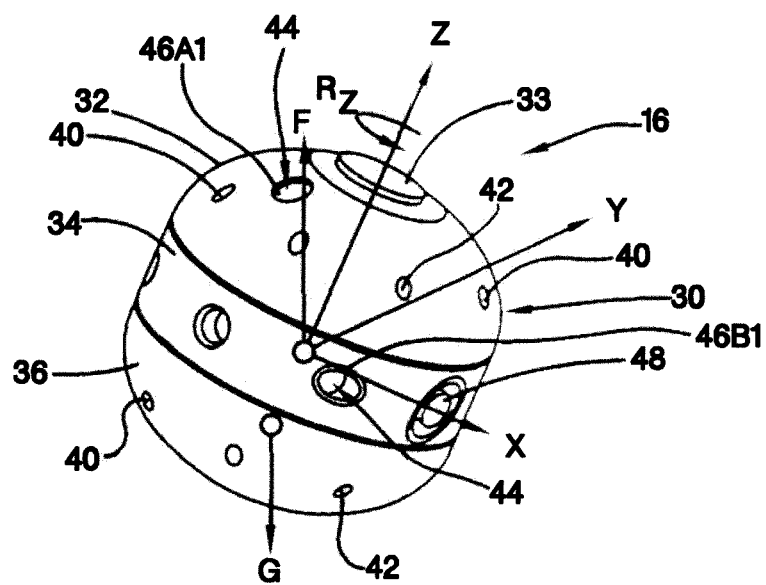
FIG. 2 is a perspective view of an inspection vehicle used within the system according to one exemplary embodiment of the present disclosure.
Figure 3:
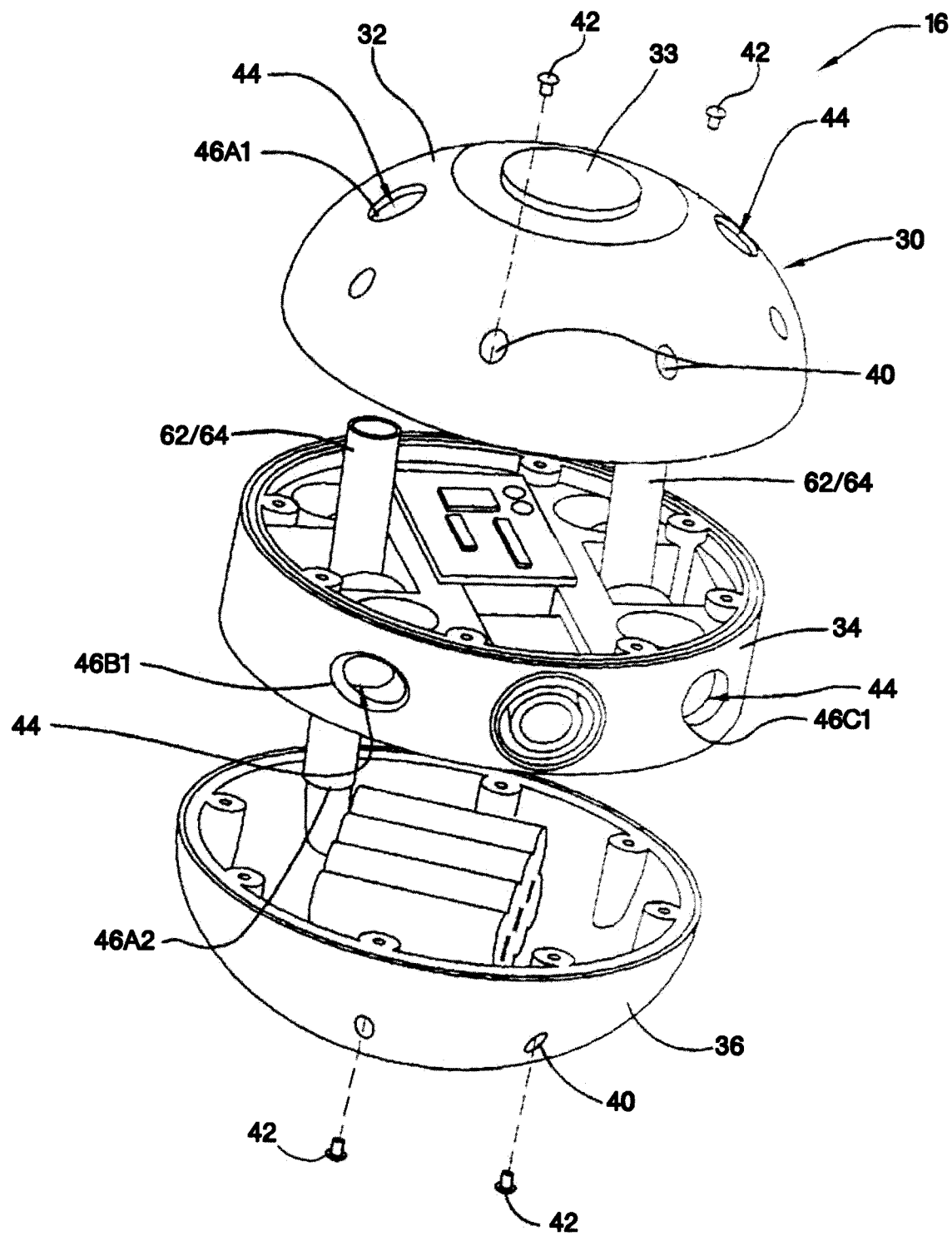
FIG. 3 is an exploded view of the inspection vehicle used within the system according to one exemplary embodiment of the present disclosure.
Figure 4:
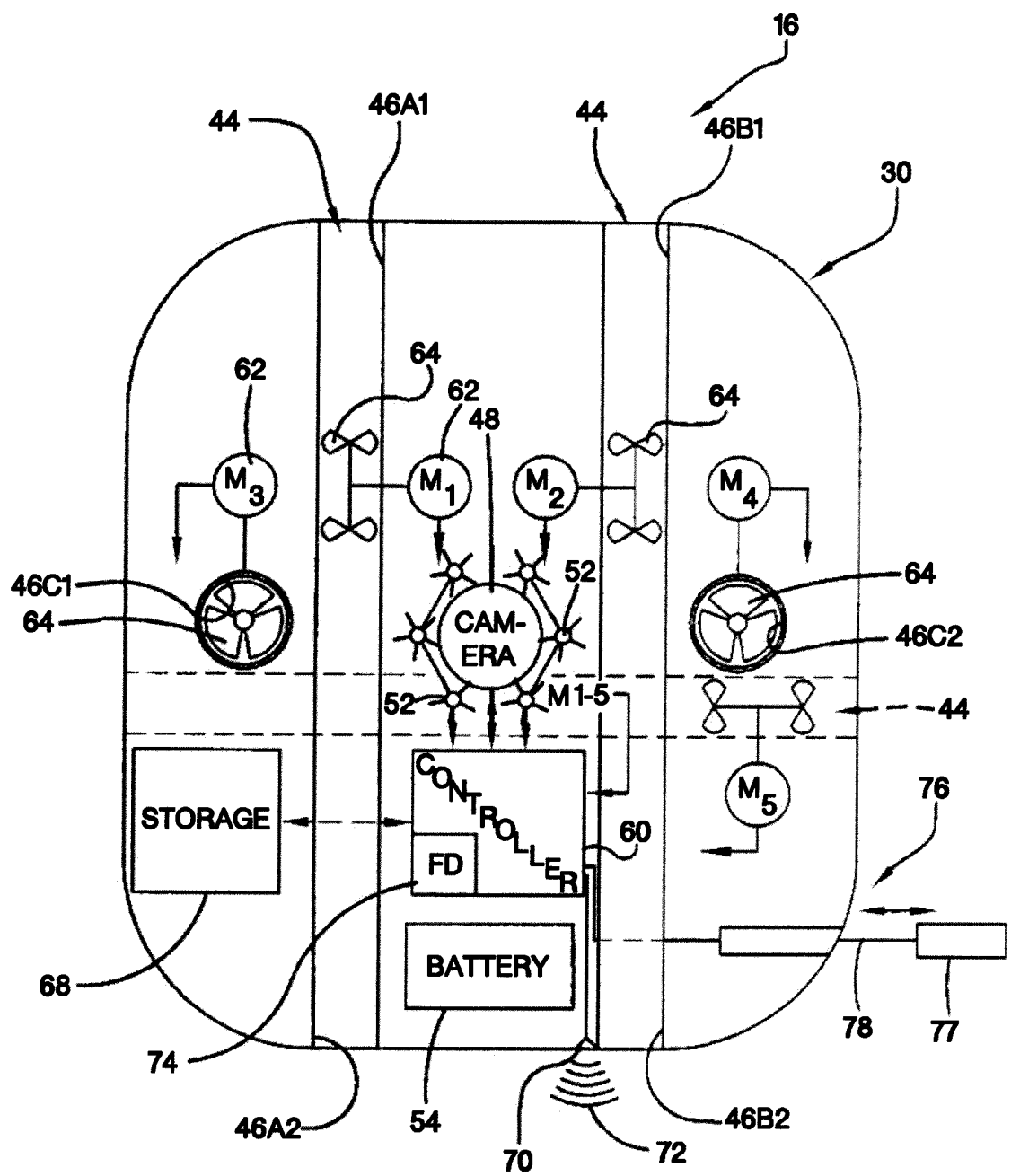
FIG. 4 is a schematic diagram of the inspection vehicle according to one exemplary embodiment of the present disclosure.

Referring now to FIGS. 2-4, the inspection vehicle 16 includes a vehicle housing 30 that is substantially cylindrical or spherical in construction with no significant protrusions or extensions that might otherwise be entangled with the internal components within the transformer 12. The vehicle housing 30 of the inspection vehicle 16 includes an upper cover 32 having a minimally extending nub 33, a middle section 34 and a lower cover 36. The nub 33 is sized so as to allow for grasping of the inspection vehicle 16 from within the transformer 12 by a tool or by an operator's hand. The nub 33 could have other shapes, such as a loop, to facilitate easy grasping, depending on the type of tool used to grasp the inspection vehicle 16. The cover 32, the middle section 34 and the cover 36 can be secured to one another with fastener apertures 40 that extend through at least the covers 32 and 36 so as to receive fasteners 42 to allow for attachment to the middle section 34. In most embodiments the fasteners 42 are maintained flush with the surface of the cover so as to minimize drag and prevent entanglement with internal components of the transformer 12. Other forms of mechanical fastening may be used, such as threaded engagement, press-fit, or mechanical clip or the like. Further, in some embodiments, the inspection vehicle 16 may only include two sections and in other embodiments the inspection vehicle 16 may include four or more sections.

Extending through the vehicle housing 30 are at least two pump flow channels designated generally by the numeral 44. These channels extend vertically and horizontally through the vehicle housing 30 and are configured so as to be sealed from the internal components of the vehicle housing 30. Each flow channel 44 provides a pair of ports 46. As shown in the drawings, numeric and alphabetic designations are provided so as to identify particular ports. For example, port 46A1 is at one end or side of the vehicle housing 30 while the opposite end of the flow channel 44 is designated by port 46A2. As such, the fluid maintained within the transformer can flow from one port 46A1 through and exit out port 46A2. In a similar manner, the oil may flow through port 46B1 and out through port 46B2. As will be discussed, components maintained within the channels move the fluid in either direction, through the inspection vehicle 16 and thus allow the inspection vehicle 16 to move within the transformer 12. It should be appreciated that alternate flow channel configurations could be implemented. For example, fluid could enter the inspection vehicle 16 through a single inlet and internal valves could route the fluid to all outlet ports. In another example, the vertical path could have one inlet port and two or more outlet ports. At least one sensor 48 is carried by the vehicle housing 30 and in some embodiments the sensor 48 is a camera. Other sensors can be used in some embodiments such as, by way of non-limiting examples, proximity sensors, acoustic sensors, electromagnetic sensors, voltage sensors, amperage sensors, pressure sensors and temperature sensors. The camera 48 is configured to receive and transmit images through a plurality of wavelength images of the internal components of the transformer 12. The wavelengths can include visible, infrared, or others as desired. These images allow an operator to monitor and inspect various components within the transformer 12.

In some embodiments, the vehicle housing 30 can include one or more light sources 52 which facilitate illumination of the area surrounding the inspection vehicle 16. In some embodiments the lights 52 can be light emitting diodes, but it will be appreciated that other illumination devices can be used. For example, one or more of the lights 52 can include ultraviolet (UV) frequencies that may be used to cure UV hardened adhesives or the like. The illumination devices are oriented so as to illuminate the viewing area of the camera 48. In some embodiments, the operator can control the intensity and wavelength of the light.

A battery pack 54 is maintained within the inspection vehicle 16 so as to power the internal components such as the sensor 48, the lights 52 and a controller 60. The controller 60 operates the sensor 48 and lights 52 and also controls operation of a motor 62 and a pump 64 which are used in combination with each of the provided pump flow channels 44. The controller 60 maintains the necessary hardware and software to control operation of the connected components and maintain the ability to communicate with the computer 18 as well as with other devices. The controller 60 provides functionality in addition to controlling the motion of the inspection vehicle 16. For example, the controller 60 can provide for a data recording function so that a high-resolution, high-speed video of the entire inspection area generated by the sensor 48 can be recorded and stored onboard by the storage device 68. On board storage may be used in instances where wireless streaming of the video is interrupted or the antenna transmission of the wireless signals has a lower than desired bandwidth. Skilled artisans will appreciate that the sensor 48 may also be a thermal camera, a sonar sensor, a radar sensor, a three-dimensional vision sensor, or any combination of sensors.

Each motor 62 is reversible so as to control the flow of fluid through the flow channels by the pump 64. In other words, each motor s operated independently of one another so as to control operation of the associated pump 64 such that rotation of the pump 64 in one direction causes the fluid to flow through the flow channel 44 in a specified direction and thus assist in propelling the vehicle housing 30 in a desired direction. The pump 64, which may also be referred to as a thruster pump, is shown as being a propeller type configuration, but other configurations such as a paddle-type pump or gear pump could be utilized.

In some embodiments, a single motor may be used to generate a flow of fluid through more than one channel. In other words, the vehicle housing 30 could provide a single inlet and two or more outlets. Valves maintained within the vehicle housing 30 could be used to control and re-direct the internal flow of the fluid and, as a result, control movement of the vehicle housing 30 within the transformer tank or housing 13. By coordinating operation of the motors with the controller, and thus the oil flowing through the vehicle housing 30, the inspection vehicle 16 can traverse all areas having sufficient space within the transformer 12. Moreover, the inspection vehicle 16 is able to maintain an orientational stability while maneuvering in the transformer tank or housing 13. In other words, the inspection vehicle 16 is stable such that it will not move end-over-end while moving within the transformer tank or housing 13. The vehicle housing 30 of the inspection vehicle 16 provides for a center of gravity designated by the capital letter G. The inspection vehicle 16 components are designed so that the center of gravity G is lower than the center of the buoyant force of the inspection vehicle 16 designated by the capital letter F. As skilled artisans will appreciate, this enables the inspection vehicle 16 to be provided with stability during traversal motion.

The vehicle housing 30 also carries a data storage device 68 which collects the data from the sensor 48 and is adequately sized to provide for storage of video or still images taken by a camera. The storage device 68 is connected to the controller 60 so as to provide for reliable transfer of the data from the sensor/camera 48 to the storage device 68. It will be appreciated that in some embodiments the storage device 68 is connected directly to the sensor 48 and the controller receives the data directly from the storage device 68. An antenna 70 is connected to the controller 60 for the purpose of transmitting data collected from the sensor 48 and also for sending and receiving control signals for controlling the motion and/or direction of the inspection vehicle 16 within the transformer 12. The antenna generates a wireless signal 72 that can be detected by the computer 18 or any intermediate device. A failure detection module 74 (designated as FD in FIG. 4) may be included in the controller 60 so as to shut down the internal components within the inspection vehicle 16 if a system failure is detected. For example, if a low battery level is detected by the controller 60, the module 74 and the controller 60 can begin a controlled shutdown of the inspection vehicle 16 which would cause the inspection vehicle 16 to float to the surface due to its positive buoyancy. In another example, a loss of connection to the remote system could also trigger a shutdown.

After floating to the surface, the vehicle housing 30 can be grasped by the nub 33. A borescope 76 may also be carried by the vehicle housing 30. One end of the borescope provides a camera 77 or other sensor connected to a retractable fiber-optic cable 78 which is connected at its opposite end to the controller 60. When in a retracted position the camera 77 is flush with the surface of the vehicle housing 30 so as to prevent entanglement with the components inside the transformer 12. When inspection of hard to view items is needed, such as the windings of the transformer 12, the cable 78 is extended while the inspection vehicle 16 is maintained in a stationary position. After images and other data are collected by the camera 77, the cable 78 is retracted. As a result, the borescope 76 allows further detailed inspection of the transformer 12.

As noted previously, the inspection vehicle 16 is configured so as to easily move around the obstacles within the transformer 12. The vehicle housing 30 is a cylindrical-shaped with sphere ends or sphere shaped configuration and is provided with a buoyant design so as to allow the inspection vehicle 16 to float to the top of the oil when it is powered off purposefully or accidentally. The inspection vehicle 16 is configured so as to allow for the thruster pumps 64 to move the inspection vehicle 16 around by selective actuation of each pump. As a result, the inspection vehicle 16 has four degrees of freedom or motion: X, Y, Z and rotation around Z. As a result, by controlling the direction of the pump thrusters 64, the inspection vehicle 16 can be easily moved.

Referring back to FIG. 1, it can be seen that the transformer 12 has at least one transformer hole 80. In general operation, the oil is inserted through any number of holes located in the top of the tank. Holes 80 may also be provided at the bottom of the tank to allow or the fluid to be drained. The holes 80 are provided with the appropriate plugs or caps. Accordingly, it will be appreciated that the size of the inspection vehicle 16 must be such that it can fit within the hole 80.

The transformer 12 may be configured with a plurality of transmit signal receivers 82 mounted on the upper corners, edges or other areas of the transformer 12, or in nearby proximity to the transformer 12. The transmit signal receivers 82 receive the wireless signal 72 from the inspection vehicle 16 to determine the position of the inspection vehicle 16 in the transformer tank or housing 13. The receivers 82 use triangulation, based on the signals 72 received or other methodology, to determine a position of the inspection vehicle 16 in the transformer tank or housing 13. This position information is then transmitted by a signal 84, either wired or wirelessly, to the computer 18. Additionally, the information collected by the sensor 48, such as visual data, is transferred to the computer or other visual receiving device separately. In other words, the informational data generated by the sensor 48 is transmitted to the computer 18 through the fluid and the tank wall with the openings 80. Use of these different communication paths may be used to prevent interference between the signals; however, some embodiments may utilize the same communication path to transfer data related to positioning, data information, and control information as appropriate. Reliable communication for the motion control of the inspection vehicle 16 and data/video streaming are required for the transformer 12 in-situ inspection. Utilizing the dielectric feature of the transformer coolant oil, the inspection vehicle 16 can be controlled by radio frequencies rather effectively. The video streaming for a Wi-Fi camera (e.g. 4.2 GHz) has been proven to be sufficient. To ensure reliable communication between the inspection vehicle 16 and the computer 18, a transceiver 85 may be inserted into the cooling oil tank through the service opening on the top of the transformer 12.

In most embodiments, the transceiver 85 is used to exchange data information from the sensor 48 and the camera 77, via the controller 60 to the computer 18; and motion control or maneuvering signals from the joystick 24 via the computer 18 to the controller 60 so as to operate the motors 62 and thrusters 64. The signal 84, transmitted by the receiver 82 is used by the computer 18 to provide a separate confirmation of the position of the inspection vehicle 16 within the transformer tank or housing 13.

The computer 18 receives the position signals 84 and information signals 72 and in conjunction with the virtual image 20 correlates the received signals to the virtual image so as to allow an operator to monitor and control movement of the inspection vehicle 16. This allows the operator to inspect the internal components of the transformer 12 and pay particular attention to certain areas within the transformer 12 if needed. By utilizing a virtual image of the internal features of the transformer 12 and the position of the inspection vehicle 16 with respect to those virtual features, the image obtained can be matched with the corresponding site inside the actual transformer tank or housing 13. Based on the visual representation of the transformer image 20 and the virtual inspection vehicle 22 in relation to the image, an operator can manipulate the joystick 24 response. The computer 18 receives the movement signals from the joystick 24 and transmits those wirelessly to the antenna 72, whereupon the controller 60 implements internally maintained subroutines to control the pump thrusters 64 to generate the desired movement. This movement is monitored in real-time by the operator who can re-adjust the position of the inspection vehicle 16 as appropriate.

In some embodiments the computer 18 can be connected to a network 86, such as the internet, so as to allow for the images or sensor data to be transferred to experts, who may be remotely located, designated by the block 88 so that their input can be provided to the operator so as to determine the nature and extent of the condition within the transformer 12 and then provide corrective action as needed. In some embodiments, control of the inspection vehicle 16 can also be transferred to an expert, who may be remotely located. In such embodiments, the expert would have another computer that can send control signals via a network to the local computer 18 that in turn sends signals to control the inspection vehicle 16 as described above.

Figure 5:
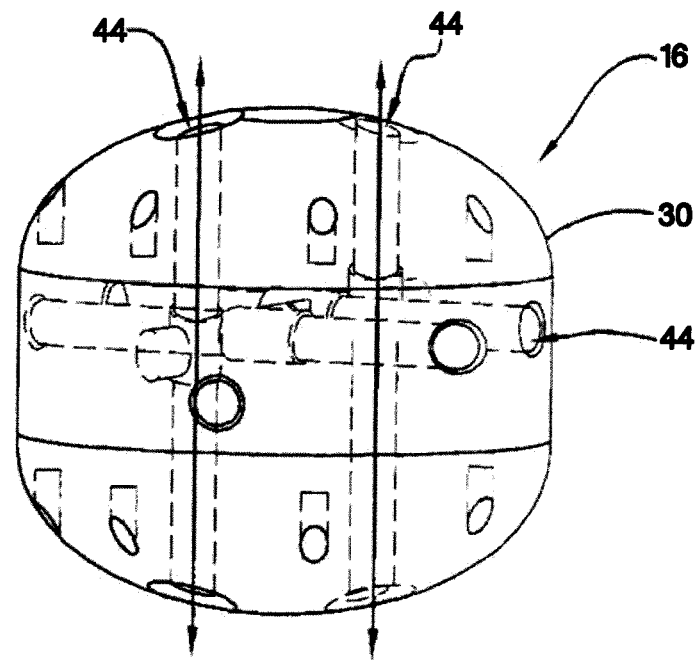
FIG. 5 is a schematic diagram of the inspection vehicle according to one exemplary embodiment of the present disclosure where two pumps under one control move the device in the Z direction.

Referring now to FIGS. 5-9, it can be seen that control of the motors and pump thrusters and their direction of fluid flow through the channels can control the motion of the inspection vehicle 16 within a fluid. For example, FIG. 5 shows the utilization of two pumps under one control so as to move the inspection vehicle 16 in a Z direction (see FIG. 2). To drive along the Z axis and to remain a stable depth, the Z axis thrusters have to run continuously. The Z thruster action can be controlled either manually by the operator or automatically by the controller. As used herein, the terminology "one control" refers to operating two pumps to operate in conjunction with one another so that the fluid flow is uniformly in one direction or the other.

Figure 6:
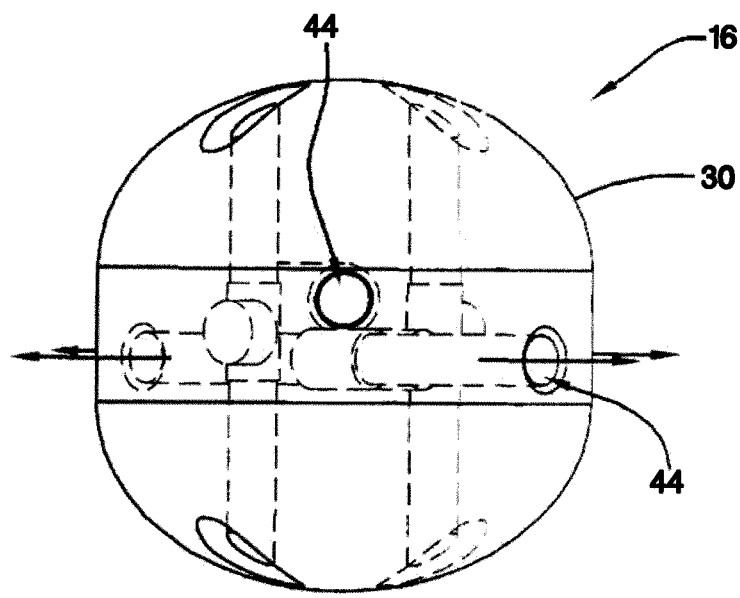
FIG. 6 is a schematic diagram of the inspection vehicle according to one exemplary embodiment of the present disclosure where two pumps under two controls move the device in the X direction.
Figure 7:
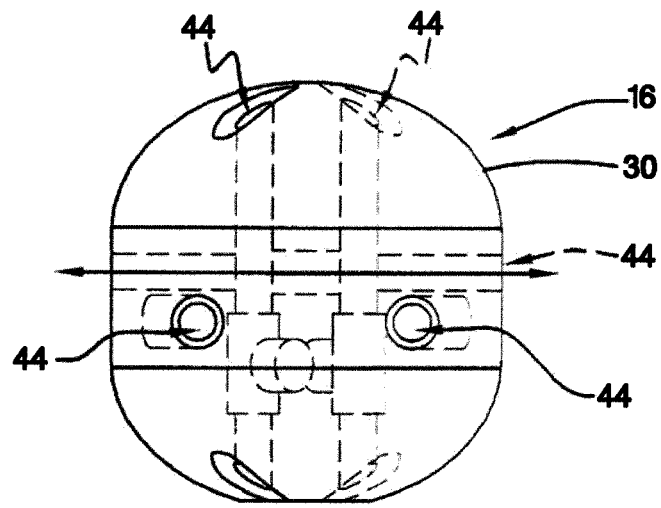
FIG. 7 is a schematic diagram of the inspection vehicle according to one exemplary embodiment of the present disclosure where a single pump under one control moves the device in the Y direction.

In FIG. 6 it can be seen that an X direction (see FIG. 2) can be obtained by utilizing two pumps under two controls so as to allow for movement in an X direction. As used herein, operation of "two pumps under two controls" means that the controller operates the pumps separately from one another. In FIG. 7 it can be seen that the inspection vehicle 16 is movable along the Y direction (see FIG. 2) wherein one pump is utilized under one control. It will be appreciated that FIG. 7 is a side view of FIG. 6 and at a slightly different elevation with respect to the X directional flow channels. As mentioned above, other embodiments could use different combinations of channels. For example, the three or four channels could exist in the Z direction. Also, other embodiments could have one inlet port and two outlet ports for a channel, or vice versa, or even use a different number of inlets and outlets. The number of pumps could also vary. For example, one pump could be used to control the flow of fluid from one inlet port which is then output through four outlet ports.

Figures 8A, 8B:
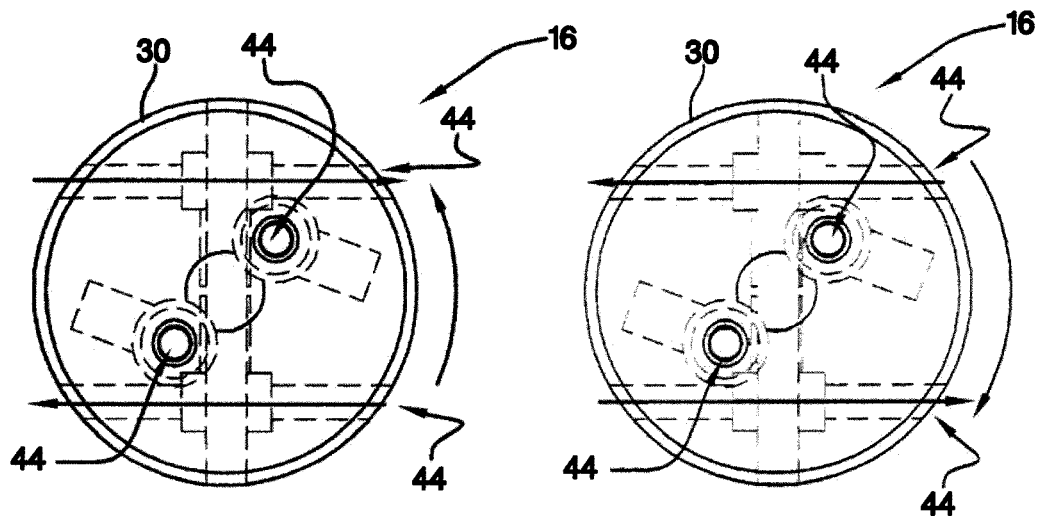
FIGS. 8A and 8B are schematic diagrams of the inspection vehicle according to one exemplary embodiment of the present disclosure wherein two pumps under one control operate to rotate the device in a counter-clockwise direction and in a clockwise direction, respectively.
Figure 9A:
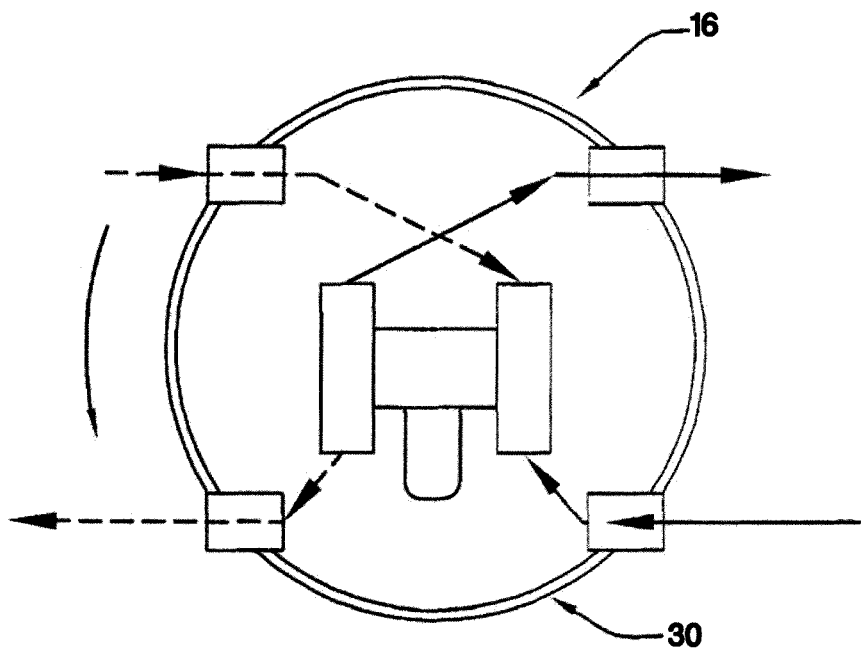
FIGS. 9A and 9B are schematic diagrams of the inspection vehicle according to one exemplary embodiment of the present disclosure wherein one pump operates to rotate the vehicle in a counter-clockwise direction and in a clockwise direction, respectively.
Figure 9B:
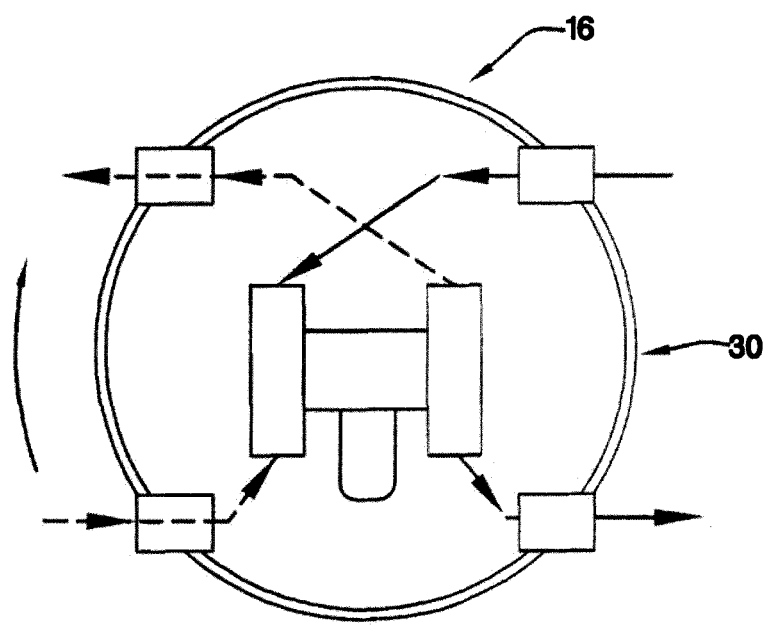

In FIGS. 8A and 8B it can be seen that two pumps under one control allow for rotation of the inspection vehicle 16. In FIG. 8A, by directing the fluid flow in one direction through one channel and an opposite direction in another channel, counter-clockwise rotation can be obtained. By reversing the flows in both channels, clockwise rotation can be obtained as seen in FIG. 8B. In another variation, FIGS. 9A and 9B show rotation of the inspection vehicle 16 utilizing one pump under one control wherein the flow is directed from one side of the inspection vehicle 16 into the inspection vehicle 16 and then back out the same side. A corresponding flow is provided by the opposite side of the inspection vehicle 16 so as to provide for rotation about the Z axis. Reversing the flow provides a corresponding reversal of the rotation of the inspection vehicle 16 along the Z axis.

The inspection vehicle 16 allows for visual and other inspection without draining the transformer oil. This is accomplished by being able to control the inspection vehicle 16 in the oil and perform visual or other inspection through the oil. The inspection vehicle 16 is constructed to be resistant to an oil environment and is properly sealed. Additionally, the inspection vehicle 16 is small enough to be put inside a transformer tank or housing 13 using existing service holes, e.g. those used for filling the transformer oil. As a result, it is not needed to unseal the transformer tank top completely. Another aspect is that the inspection vehicle 16 can be controlled from the outside of the transformer using a joystick 24 and computing device 18 which may also be used for displaying visual data from the sensor(s).

As internal regions of a transformer have no ambient light, the sensor 48 utilizes a supporting light source carried by the inspection vehicle 16. Various wavelengths of light may be used (visible and/or non-visible light) for detailed inspection of the transformer 12 components inside. A remotely controlled arm that guides a thin fiber-optic camera head inside the transformer 12 winding block may also be used. Still another aspect of the inspection vehicle 16 is that all materials employed in the construction of the inspection vehicle 16 are oil compatible. This is to avoid any type of contamination introduced by the inspection vehicle 16, so that the transformer 12 can directly return to operation after the inspection of inspection vehicle 16 without oil treatment.

Referring generally to FIGS. 10-13, inspection methods are disclosed for acquiring, handling, displaying and annotating inspection data obtained by one or more sensors associated with an inspection vehicle. By providing an operator with the ability to categorize and attach voice recording on the fly, a detailed inspection report can be generated in real time at each inspection event. The methods include registering and displaying previous inspection results so that trends in equipment change can be readily identified.

Once the inspection vehicle has been moved to the inspection area and is ready to start the inspection with onboard sensors, a voice assisted and controller assisted inspection chart generation system can automatically generate an inspection chart, record the inspection sensor data, auto-populate the fields listed in the chart, efficiently record the inspection results and provide organized data output including inspection time, inspection task, inspection location and inspection results.

Input from an operator's voice, location of the inspection vehicle, or other manual input selection can be tied to a charting system that includes an inspection task list and automatic generation of an inspection chart, for example, windings, cables, support members, or the like in a transformer. After the operator confirms the inspection chart, the control system will start to record the inspection data and may populate the field of the next inspection item in the chart. The location of the inspection vehicle, the time of inspection, the type of sensor (2D video, 3D sensor, thermal camera, microphone, etc.) are examples of some of the potential fields in an inspection chart. The operator can then enter an inspection result such as a certainty level of the inspection by voice entry or typing entry. After the operator completes all the inspection items in the chart, the control system will end the inspection data recording and guide the operator to move the inspection vehicle to the next inspection area. After all the inspection tasks are completed, the system can organize the recorded inspection data with the inspection time, task, location and results and prepare for offline review on the inspection results.

The system permits an operator to "voice over" data recordings and other annotation in real time during inspection. This annotation capability allows the operator to tie annotation to visual information. The system may prepare and display an inspection check list in a user interface and allow the operator to review maintenance history of a particular component. The system may suggest certain inspection items based on the analysis of previous inspection and repair history.

The system may also display inspection images and data from previous inspections during a current inspection event. Based on the location of the inspection vehicle and the camera view point, inspection task or operator voice input, the system can search the previous inspections data for related images and data. The operator can then compare the images and data from previous inspection with the images and data from the current inspection.

During the online inspection, the system may enhance the visual data (video and image), such as for example, adjusting the brightness and contrast filtering out noise to improve video quality and provide improvement in visual presentation of the inspection data. Also the system may apply an image analysis algorithm for a specified inspection task to help the operator determine potential problems with the inspection components. The system can overlay a rough scene reconstruction via a 3D Red, Green, Blue, Depth (RGBD) cloud model from the inspection event to a computer generated CAD model of a known component to compare, analyze and suggest movement of the inspection vehicle and record inspection data from a different vantage point. In off-line inspection, the system may reconstruct the 3D scene from the visual data and allow the operator to rotate, pan, or zoom, etc., the inspection scene to thoroughly inspect the components from different views.

The system may automatically upload inspection data as soon as a viable internet pathway is available. Based on the Quality of Service (QoS) of the network connection, the system may upload inspection data based on bandwidth requirement and priority of inspection data. The inspection chart with operator input (voice/typing) may be uploaded and then a high resolution image and video may be uploaded later. This feature enables the cloud inspection for remote operation and analysis. The inspection data can be sent to an expert analyst for monitoring the inspection process. The inspection data can be transmitted to a server with more computational power to analyze the current inspection data with the previous inspection data, health and repair history of the component. A computer server can provide a real-time inspection conclusion or suggestions for new inspection tasks.

Figure 10:
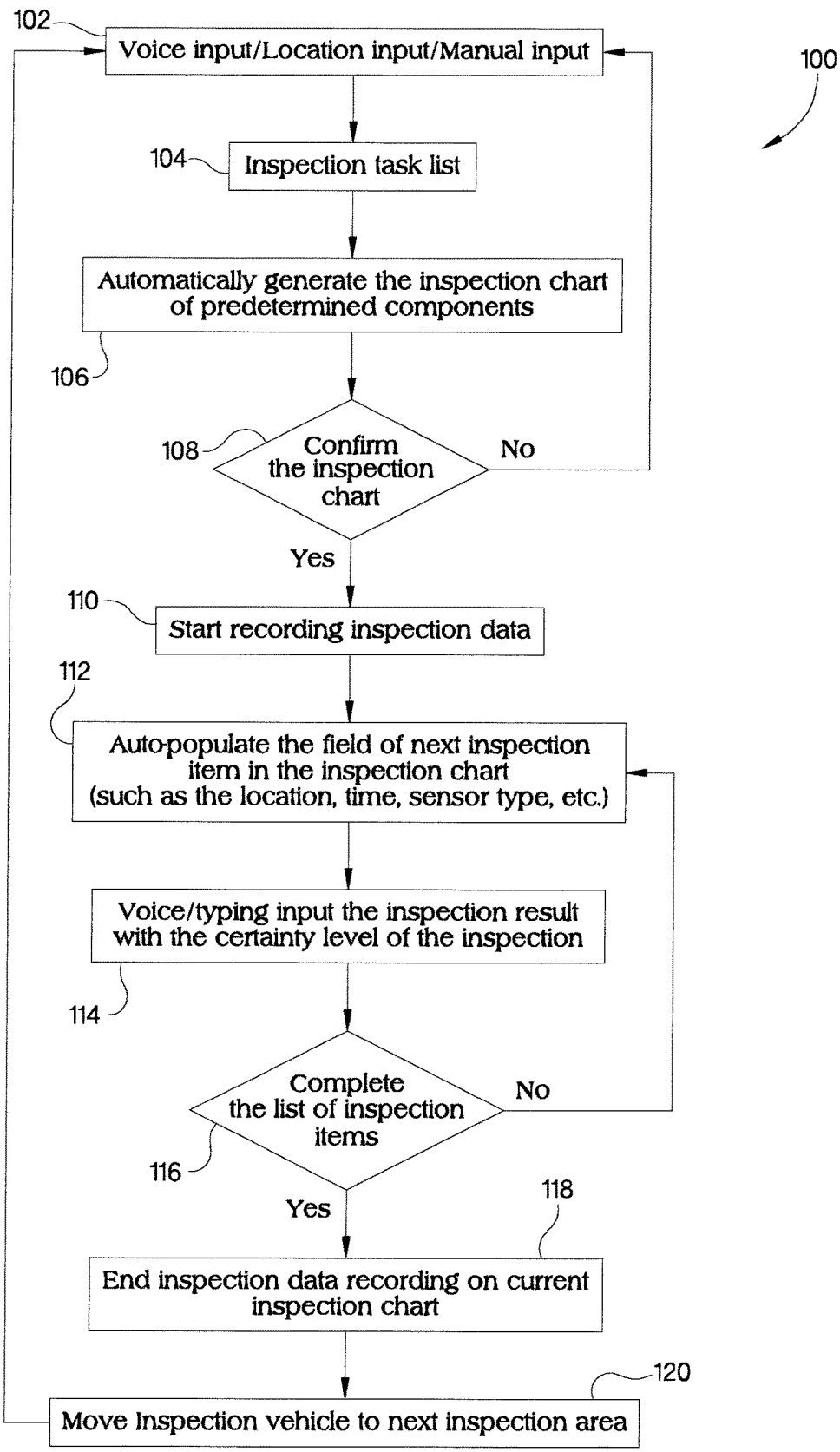
FIG. 10 is a flow chart illustrating a method for real time acquiring, handling and displaying inspection data according to another embodiment of the present disclosure.

Referring now specifically to FIG. 10, a first method 100 for acquiring, handling and displaying inspection data obtained by the inspection vehicle 16 is illustrated. Beginning at step 102, one or more operator inputs such as a voice input, a location input or other manual input may be transmitted to the control system. At step 104, the control system may generate an inspection task list that defines a feature and location for the inspection vehicle to obtain visual or other sensor data. At step 106 the control system may automatically generate an inspection chart of items to inspect. By way of example and not limitation such items may include windings, cables, support structure and various types of connectors. At step 108 the control system will confirm that an item defined in the inspection chart has been identified and located. If the inspection vehicle fails to identify an item on the inspection chart, then at step 108 the method 100 will return back to step 102 and the operator may provide additional input into the system such as voice input, location input or other manual input. After confirmation of the listed inspection item in the inspection chart, the method 100 proceeds to step 110 and the control system will start recording inspection data related to that inspection item. The method 100 then moves to step 112 where the control system may then populate field details for the next inspection item in the inspection chart. Such field details may include the location of the item, time or duration required for the sensing process, sensor type, as well as other similar inspection details. At step 114, the operator may enter further input data either by voice input or typing input to include information regarding a certainty level of the inspection result or the like. At step 116 the control system determines whether all of the items on the inspection list have been sufficiently inspected. If all items have been inspected then the inspection data recording is ended for the current inspection chart at step 118. If the list of inspection items has not been completed at step 116, then the method loops back to step 112 and populates the field for the next inspection item in the inspection chart. Continuing from step 118, if additional inspection is required, the inspection vehicle is moved to the next inspection area at step 120 and then the method starts over at step 102.

Figure 11:
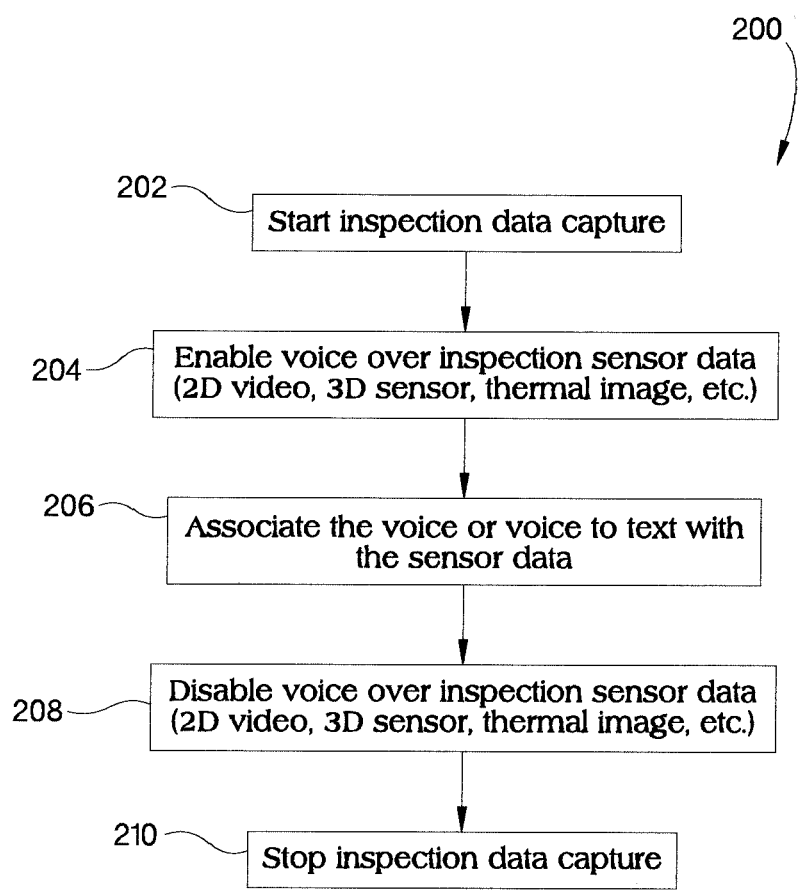
FIG. 11 is a flow chart illustrating another method for real time acquiring, handling and displaying inspection data according to another embodiment of the present disclosure.

Referring now to FIG. 11, a flowchart illustrating a second exemplary method 200 is described. Beginning at step 202 the inspection vehicle initiates a data capture and recording process for one or more sensor outputs operable for inspecting selected items in an inspection task list. At step 204, the controller enables voice over input provided by an operator so that the voice over data can be recorded in real time as the inspection vehicle is performing an inspection process. The voice over data can be combined with various sensor data, such non-limiting examples may include 2D video, 3D sensors, thermal images, etc., so that the data can be reviewed with contemporaneous analysis from the operator. At step 206, the controller will associate the voice or text input from the operator with the sensor data so that the inspection recordings can be reviewed any time during or after the inspection. At step 208 the controller will disable recording for voice over and sensor data after completion of the inspection event. At step 210, the inspection vehicle will stop recording inspection data.

Figure 12:
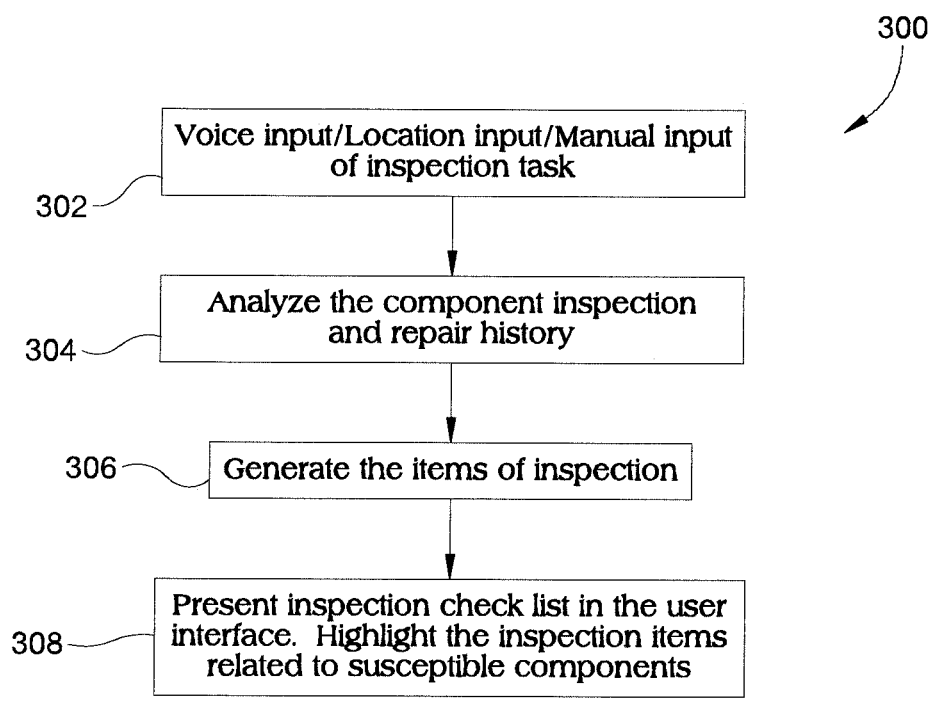
FIG. 12 is a flow chart illustrating another method for real time acquiring, handling and displaying inspection data according to another embodiment of the present disclosure.

Referring now to FIG. 12 a flowchart illustrating a third exemplary method 300 is described. Beginning at step 302, the method 300 permits voice input, location input and or manual input of an inspection task for the inspection vehicle. At step 304 the controller analyzes component inspection and repair history and then based in part on the repair history of a certain components, the controller may generate an item task list for inspection at step 306. At step 308 the controller generates and displays an inspection check list that can be displayed on an operator interface. The controller can also highlight inspection items related to susceptible components on the item task list.

Figure 13:
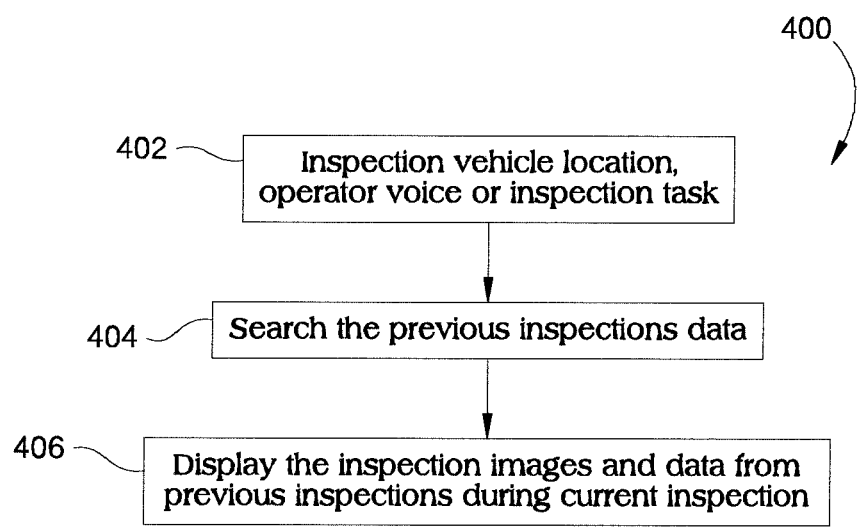
FIG. 13 is a flow chart illustrating another method for real time acquiring, handling and displaying inspection data according to another embodiment of the present disclosure.

Referring now to FIG. 13, a flowchart illustrating a fourth exemplary method 400 is described. At step 402 the controller receives input such as inspection vehicle location, operator voice input and inspection tasks. At step 404, the controller may search and retrieve the previous inspection data related to the current inspection task list. At step 406, the controller may display the inspection images and data from previous inspections during the current inspection event, so that real time analysis between present inspection data and past data can be performed.

In one aspect the present disclosure includes an inspection system comprising: an inspection vehicle operable in an enclosed liquid medium with components located therein; at least one sensor operably coupled with the inspection vehicle; a control system including an electronic controller operably coupled with the inspection vehicle, the control system configured to display data transmitted from the sensor and display input data from an operator on one or more display devices in real time.

In refining aspects the inspection system includes input data from the operator including a plurality of input modes; wherein the input modes includes at least one of a voice input, a manual input and a location input; wherein the controller ties input from the operator to corresponding sensor data such that the operator input and corresponding sensor data input is retrievable together by the control system; wherein the sensor data and the operator input data are stored to a memory associated with the control system; wherein the controller defines and displays an inspection task list during operation of the inspection vehicle; wherein the controller is configured to automatically generate an inspection chart during operation of the inspection vehicle; wherein the inspection chart includes at least one of a field inspection item and an associated inspection location; wherein the controller records inspection data transmitted from the inspection vehicle for a first field item listed in the inspection chart; wherein the controller is operable to move the inspection vehicle to a second inspection location after completion of inspection and recordation of data at a first inspection location defined by the inspection chart; wherein the controller populates a second field item in the inspection chart; wherein the operator input includes an input of a certainty level of an inspection result; wherein the controller is operable to retrieve inspection and repair history of a component and determine additional field items to inspect based on the repair history; wherein the control system is operable to retrieve and display data from one or more previous inspection events and overlay the previous inspection data with data obtained in a current inspection event; wherein the operator is located remotely from the inspection location; and wherein the control system is operable to overlay display data transmitted from the sensor and display input data from an operator.

Another aspect of the present disclosure includes a method for inspecting components within a housing at least partially filled with a liquid, the method comprising: moving an inspection vehicle to a first location within the housing; sensing a field inspection item associated with a component at the first location; transmitting data obtained during the sensing event to a control system; displaying a portion of the transmitted data on a display unit; displaying input data provided by an operator with the transmitted data on one or more display units.

In refining aspects, the overlaying of the input data occurs in real time as the inspection vehicle is in operation; wherein input data from the operator includes at least one of a voice input, a manual input and a location input; comprising tying the input from the operator to corresponding sensor data and storing each together in a memory device; comprising displaying an inspection task list during operation of the inspection vehicle; comprising automatically generating an inspection chart during operation of the inspection vehicle; comprising inspecting at least one field item associated with the inspection chart; comprising recording inspection data transmitted from the inspection vehicle for a first field item listed in the inspection chart; comprising moving the inspection vehicle to a second inspection location after recording data at a first inspection location; comprising populating a second field item in the inspection chart; comprising inputting a certainty level of an inspection result; comprising analyzing inspection and repair history of a component and generating additional field items to inspect based on the analyzing; comprising displaying an inspection check list for the additional field items; comprising retrieving and displaying data from one or more previous inspection events and overlaying the display with data obtained in a current inspection event; further comprising transmitting inspection data to an expert at a remote location for analysis; and further comprising overlaying input data provided by an operator with the transmitted data.

Another aspect of the present disclosure a method comprising: moving a submersible inspection vehicle to a fist inspection area; transmitting one or more of a voice input, a location input or a manual input to a control system from the operator; generating an inspection task list for the submersible inspection vehicle based at least partially on the input from an operator; displaying an inspection chart for a first field item associated with the task list; and sensing and recording inspection data for the first field item.

In refining aspects, the present disclosure further comprising: populating the inspection task list with a second field item on the inspection chart after completing inspection of the first field item; adding a voice over input, a location input and/or a manual input to the inspection data; moving the inspection vehicle to a second inspection area after completing inspection tasks at the first inspection area; wherein the input includes a voice or type overlay to characterize a certainty level of the inspection results; comprising: analyzing inspection and repairing history of a component; determining additional field items to inspect based on analysis of the inspection and repair history; and further comprising displaying inspection images and data from previous inspections along with data from a current inspection.

While the application has been illustrated and described in detail in the drawings and foregoing description, the same is to be considered as illustrative and not restrictive in character, it being understood that only the preferred embodiments have been shown and described and that all changes and modifications that come within the spirit of the applications are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the application, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. An inspection system comprising:
   an inspection vehicle operable in an enclosed liquid medium with components located therein;
   at least one sensor operably coupled with the inspection vehicle;
   a control system including an electronic controller operably coupled with the inspection vehicle, the control system configured to display data transmitted from the sensor and display input data from an operator on one or more display devices in real time,
   wherein the controller ties input from the operator to corresponding sensor data such that the operator input and corresponding sensor data is retrievable together by the control system.

2. The inspection system of claim 1, wherein input data from the operator includes a plurality of input modes.

3. The inspection system of claim 2, wherein the plurality of input modes includes at least one of a voice input, a manual input and a location input.

4. The inspection system of claim 1, wherein the sensor data and the operator input data are stored to a memory associated with the control system.

5. The inspection of claim 1, wherein the controller defines and displays an inspection task list during operation of the inspection vehicle.

6. The inspection system of claim 1, wherein the controller is configured to automatically generate an inspection chart during operation of the inspection vehicle.

7. The inspection system of claim 6, wherein the inspection chart includes at least one of a field inspection item and an associated inspection location.

8. The inspection system of claim 6, wherein the controller records inspection data transmitted from the inspection vehicle for a first field item listed in the inspection chart.

9. The inspection system of claim 1, wherein the controller is operable to move the inspection vehicle to a second inspection location after completion of inspection and recordation of data at a first inspection location defined by an inspection chart.

10. The inspection system of claim 9, wherein the controller populates a second field item in the inspection chart.

11. The inspection system of claim 1, wherein the operator input includes an input of a certainty level of an inspection result.

12. The inspection system of claim 1, wherein the controller is operable to retrieve inspection and repair history of a component and determine additional field items to inspect based on the repair history.

13. The inspection system of claim 1, wherein the control system is operable to retrieve and display data from one or more previous inspection events and display the previous inspection data with data obtained in a current inspection event.

14. The inspection system of claim 1, wherein the operator is located remotely from the inspection location.

15. The inspection system of claim 1, wherein the control system is operable to overlay display data transmitted from the sensor and display input data from the operator.

16. A method for inspecting components within a housing at least partially filled with a liquid, the method comprising:
   moving an inspection vehicle to a first location within the housing;
   sensing a field inspection item associated with a component at the first location;
   transmitting data obtained during the sensing event to a control system;

displaying a portion of the transmitted data on a display unit;

displaying input data provided by an operator with the transmitted data on one or more display units; and tying the input from the operator to corresponding sensor data and storing each together in a memory device.

17. The method of claim 16, wherein displaying the input data provided by the operator with the transmitted data comprises overlaying the input data in real time as the inspection vehicle is in operation.

18. The method of claim 16, wherein input data from the operator includes at least one of a voice input, a manual input and a location input.

19. The method of claim 16, further comprising displaying an inspection task list during operation of the inspection vehicle.

20. The method of claim 16, further comprising automatically generating an inspection chart during operation of the inspection vehicle.

21. The method of claim 20 further comprising inspecting at least one field item associated with the inspection chart.

22. The method of claim 21 further comprising recording inspection data transmitted from the inspection vehicle for a first field item listed in the inspection chart.

23. The method of claim 22 further comprising moving the inspection vehicle to a second inspection location after recording data at a first inspection location.

24. The method of claim 22 further comprising populating a second field item in the inspection chart.

25. The method of claim 16 further comprising inputting a certainty level of an inspection result.

26. The method of claim 16 further comprising analyzing inspection and repair history of a component and generating additional field items to inspect based on the analyzing.

27. The method of claim 26 further comprising displaying an inspection check list for the additional field items.

28. The method of claim 16 further comprising transmitting inspection data to an expert at a remote location for analysis.

29. A method for inspecting components within a housing at least partially filled with a liquid, the method comprising:

moving an inspection vehicle to a first location within the housing;

sensing a field inspection item associated with a component at the first location;

transmitting data obtained during the sensing event to a control system;

displaying a portion of the transmitted data on a display unit, displaying input data provided by an operator with the transmitted data on one or more display units; and retrieving and displaying data from one or more previous inspection events and overlaying the display with data obtained in a current inspection event.

30. A method for inspecting components within a housing at least partially filled with a liquid, the method comprising:

moving an inspection vehicle to a first location within the housing;

sensing a field inspection item associated with a component at the first location;

transmitting data obtained during the sensing event to a control system;

displaying a portion of the transmitted data on a display unit; displaying input data provided by an operator with the transmitted data on one or more display units; and overlaying input data provided by an operator with the transmitted data.

* * * * *